United States Patent
Reynolds

(10) Patent No.: US 6,853,218 B1
(45) Date of Patent: *Feb. 8, 2005

(54) MULTIPORT ARBITRATION USING PHASED LOCKING ARBITERS

(75) Inventor: Grahame K. Reynolds, Southhampton (GB)

(73) Assignee: Cypress Semiconductor Corp., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/742,179

(22) Filed: Dec. 19, 2003

Related U.S. Application Data

(63) Continuation of application No. 09/877,660, filed on Jun. 7, 2001, now Pat. No. 6,674,306.

(51) Int. Cl.[7] .................................................. H03K 3/02
(52) U.S. Cl. ............................. 326/94; 326/21; 326/26; 327/198; 327/199; 327/22; 327/23
(58) Field of Search ............................. 326/94, 11, 12; 327/142, 198, 199, 210–212, 200–203

(56) References Cited

U.S. PATENT DOCUMENTS

| | | | |
|---|---|---|---|
| 5,081,377 A | 1/1992 | Freyman | 307/480 |
| 5,489,865 A | 2/1996 | Colvin, Sr. | 327/198 |
| 5,519,837 A * | 5/1996 | Tran | 710/111 |
| 5,638,015 A | 6/1997 | Gujral et al. | 327/144 |
| 5,754,070 A | 5/1998 | Baumann et al. | 327/198 |
| 5,789,945 A | 8/1998 | Cline | 326/94 |
| 5,875,338 A * | 2/1999 | Powell | 710/240 |
| 6,072,346 A | 6/2000 | Ghahremani | 327/198 |
| 6,111,436 A | 8/2000 | Molnar | 327/19 |
| 6,184,701 B1 | 2/2001 | Kim et al. | 326/21 |
| 6,498,513 B1 | 12/2002 | Reynolds | 326/94 |
| 6,515,517 B1 | 2/2003 | Reynolds | 326/94 |

OTHER PUBLICATIONS

Grahame K. Reynolds, "Method and Apparatus for the Use of Discriminators for Priority Arbitration", U.S. Appl. No. 09/877,659, filed Jun. 7, 2001.

* cited by examiner

*Primary Examiner*—Vibol Tan
(74) *Attorney, Agent, or Firm*—Christopher P. Maiorana, PC

(57) ABSTRACT

An apparatus comprising a first arbiter cell, a second arbiter cell and a selection device. The first arbiter cell may be configured to lock if one or more requests are not resolved within a first predetermined time period. The second arbiter cell may be configured to dominate if the first arbiter cell enters a metastable state. The selection device may be configured to provide arbitration between the first and second arbiter cells within a second predetermined time period.

19 Claims, 5 Drawing Sheets

MULTIPORT ARBITRATION USING PHASED LOCKING ARBITERS

This is a continuation of U.S. Ser. No. 09/877,660, filed Jun. 7, 2001 which is now a U.S. Pat. No. 6,674,306.

CROSS REFERENCE TO RELATED APPLICATIONS

The present application may relate to application Ser. No. 09/877,657, filed Jun. 7, 2001, now U.S. Pat. No. 6,498,513, Ser. No. 09/877,659, filed Jun. 7, 2001, and Ser. No. 09/877,658, filed Jun. 7, 2001, now U.S. Pat. No. 6,515,517, which are each hereby incorporated by reference in their entirety.

FIELD OF THE INVENTION

The present invention relates to a method and/or architecture for implementing arbitration scheme generally and, more particularly, to an implementation for multiport arbitration using phased locking arbiters.

BACKGROUND OF THE INVENTION

Hardware devices are employed within computer systems to assist in determining the availability of computer resources (i.e., a memory chip, a hard disk drive, etc.) which can only be controlled and accessed by one requesting device at a time. However, metastable conditions can exist when contention between requests from different devices occurs. Arbitrators (or arbiters) have been designed to reduce bus contention through flags (or other such means). However, arbitrators can enter metastable states during simultaneous requests. Conventional arbitrators can therefore enter an undecided state and remain for an indefinite period of time, causing undesirable results (i.e., a system crash or hang, etc.).

Referring to FIG. 1, a circuit 10 is shown illustrating a conventional arbitration circuit. The circuit 10 comprises a NAND gate 12, a NAND gate 14 and an interlock circuit 16. The NAND gate 12 receives the signal A and an output from the NAND gate 14. The NAND gate 14 receives a signal B and an output from the NAND gate 12. The interlock circuit 16 presents a signal OUTA and a signal OUTB in response to the signal from the NAND gates 12 and 14. The NAND gates 12 and 14 are implemented in a cross-coupled configuration. Therefore, the NAND gates 12 and 14 can enter a metastable condition.

Referring to FIG. 2, a timing diagram of the circuit 10 is shown. The input A and the input B are shown crossing between a time T1 and a time T2. The period between the time T1 and T2 illustrates the metastable event which can cause a push out. The circuit 10 is subject to metastability when the inputs A and B change states simultaneously.

The interlock circuit 16 attempts to resolve metastable states, but does not prevent metastable events. The arbitration circuit 10 implements cross coupled NAND arbiters (12 and 14) which cause delays due to metastable events. The resolution (or recovery) time of the cross coupled arbiters 12 and 14 is not predictable. While the interlock circuit 16 can try to prevent metastable states from occurring on the outputs, the interlock circuit 16 does not resolve the occurrence of the metastable events. Conventional arbitrators attempt to reduce the probability of metastable occurrences rather than eliminate such occurrences.

It is desirable to provide a method and/or architecture that provides multiport arbitration using phased locking arbiters.

SUMMARY OF THE INVENTION

The present invention concerns an apparatus comprising a first arbiter cell, a second arbiter cell and a selection device. The first arbiter cell may be configured to lock if one or more requests are not resolved within a first predetermined time period. The second arbiter cell may be configured to dominate if the first arbiter cell enters a metastable state. The selection device may be configured to provide arbitration between the first and second arbiter cells within a second predetermined time period.

The objects, features and advantages of the present invention include providing a method and/or architecture for detecting when a cross coupled arbiter has entered a metastable state that may (i) force each request in succession, (ii) be implemented in dual port memory applications, (iii) reduce or eliminate delays due to metastability issues, (iv) implement an interlock element to disable outputs until a metastable condition is resolved, (v) implement low voltage threshold inverters to avoid oscillation, (vi) provide a controlled arbitration time and/or (vii) arbitrate between requests for access to a memory.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
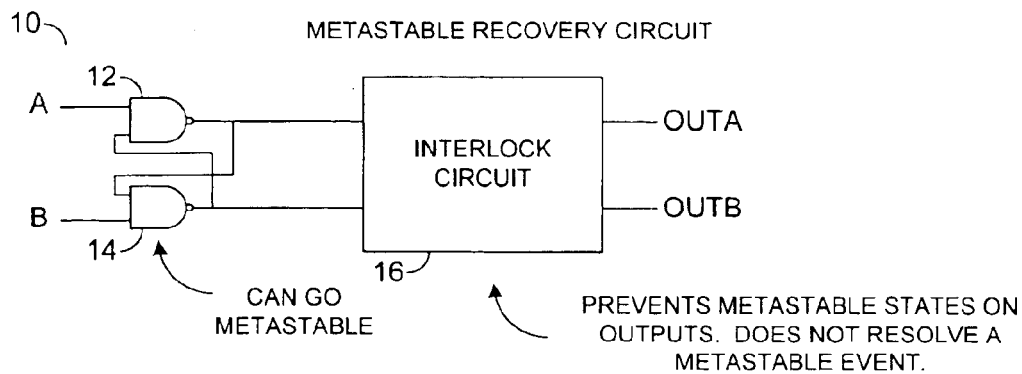
FIG. 1 is a block diagram of a conventional metastable recovery circuit.
Figure 2:
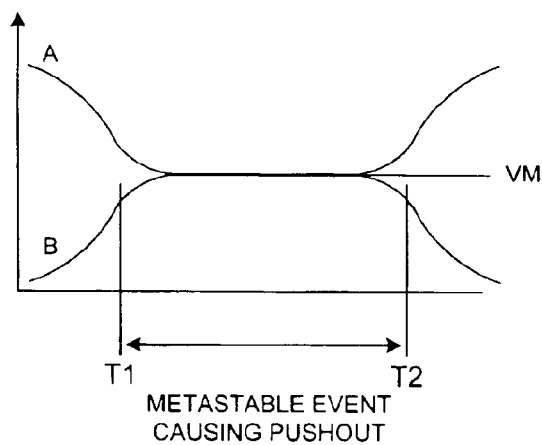
FIG. 2 is a timing diagram of the conventional circuit of FIG. 1.
Figure 3:
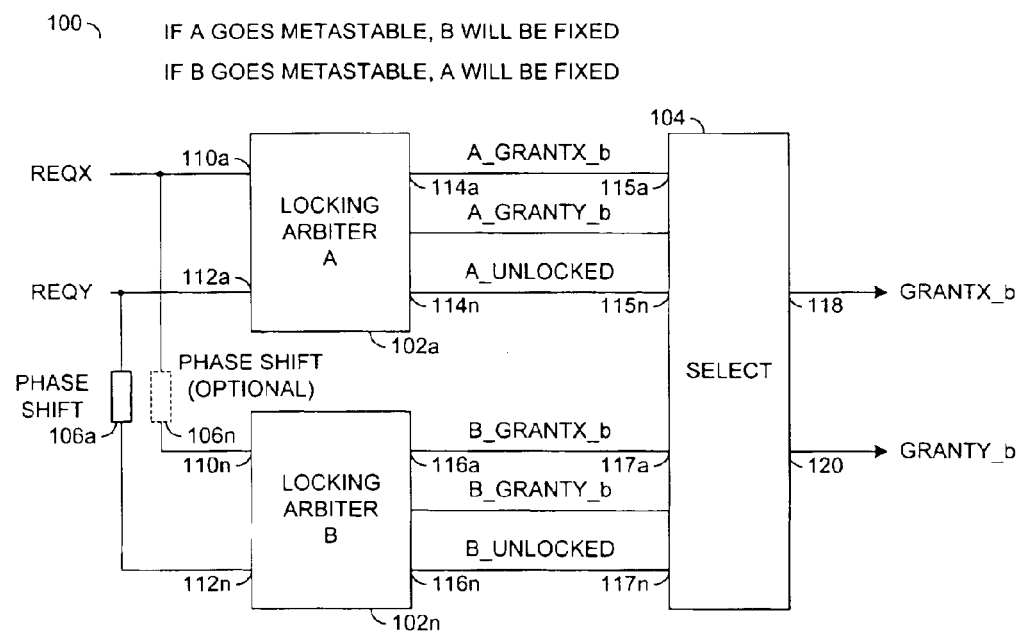
FIG. 3 is a block diagram of a preferred embodiment of the present invention.

Referring to FIG. 3, a block diagram of a circuit 100 is shown in accordance with a preferred embodiment of the present invention. The circuit 100 may be implemented to arbitrate memory requests for dual-port memories. In another example, the circuit 100 may be implemented to arbitrate multiport memories. For example, multiple arbiters may be cascaded into a tree configuration to provide arbitration for multiport memories (e.g., memories with two or more ports). The circuit 100 may also provide a multi-port arbitration scheme implementing phased locking arbiters. For example, the circuit 100 may provide arbitration between two requests for access to a dual-port memory.

The circuit 100 generally comprises a number of arbiters devices (or circuits) 102a–102n and a select device (or circuit) 104. In one example, the arbiters 102a–102n may be implemented as locking arbiters. When arbitration occurs within the circuit 100, the arbiter 102a may lock if not resolved within a predefined time interval. The secondary arbiter 102n may become dominant if the primary arbiter 100a becomes metastable. The select circuit 104 may be implemented to interface between the primary and secondary arbiters 102a and 102n to provide arbitration within a known time and without delays due to metastable events.

The circuit 100 may additionally comprise a number of phase shift devices (or circuits) 106a–106n. In another example, the phase shift circuits 106a–106n may be programmable (or configurable). The circuit 100 may require only a single phase shift circuit. However, a particular number of phase shift circuits 106a–106n may be varied in order to meet the design criteria of a particular implementation. For example, the number of phase shift circuits 106a–106n may be related to a number of ports of a particular memory device.

Each of the arbiters 102a–102n may have an input 110 that may receive a signal (e.g., REQX) and an input 112 that may receive a signal (e.g., REQY). The signals REQX and REQY may be implemented as request signals. The request signals REQX and REQY may be active high. Additionally, once a request has been serviced an acknowledgment signal (not shown) may indicate that the request is completed. The request signals REQX and REQY may then be de-asserted. Additionally, the arbiters 102a–102n may be configured to receive a phase shift of the request signals REQX and/or REQY via the phase shift devices 106a-106n.

The arbiter 102a may have a number of outputs 114a–114n that may present a number of signals (e.g., A_GRANTX_B, A_GRANTY_B, and A_UNLOCKED) to a number of inputs 115a–115n of the select circuit 104. The arbiter 102n may have a number of outputs 116a–116n that may present a number of signals (e.g., A_GRANTX_B, B_GRANTY_B, and B_UNLOCKED) to a number of inputs 117a–117n of the select circuit 104. The signals A_GRANTY_B, A_GRANTX_B, B_GRANTY_B, and B_GRANTX_B may be implemented as bus grant signals. The signals A_UNLOCKED and B_UNLOCKED may be implemented as lock signals. The locking arbiters 102a–102n may present the various grant and lock signals in response to the signals REQX and REQY or a phase shifted signal thereof.

The select circuit 104 may receive the signals A_GRANTY_B, A_GRANTX_B, B_GRANTY_B, B_GRANTX_B A_UNLOCKED, and B_UNLOCKED. The select circuit 104 may also have an output 118 that may present a signal (e.g., GRANTX_B) and an output 120 that may present a signal (e.g., GRANTY_B). The signals GRANTX_B and GRANTY_B may be implemented as bus grant signals. The select circuit 104 may select a particular bus grant (GRANTX_B or GRANTY_B) in response to the signals A_GRANTY_B, A_GRANTX_B, B_GRANTY_B, B_GRANTX_B A_UNLOCKED, and B_UNLOCKED. The select circuit 104 may be implemented between the primary arbiters 102a and the secondary arbiter 102n to provide arbitration within a known time and without delays due to metastable events.

Figure 4:
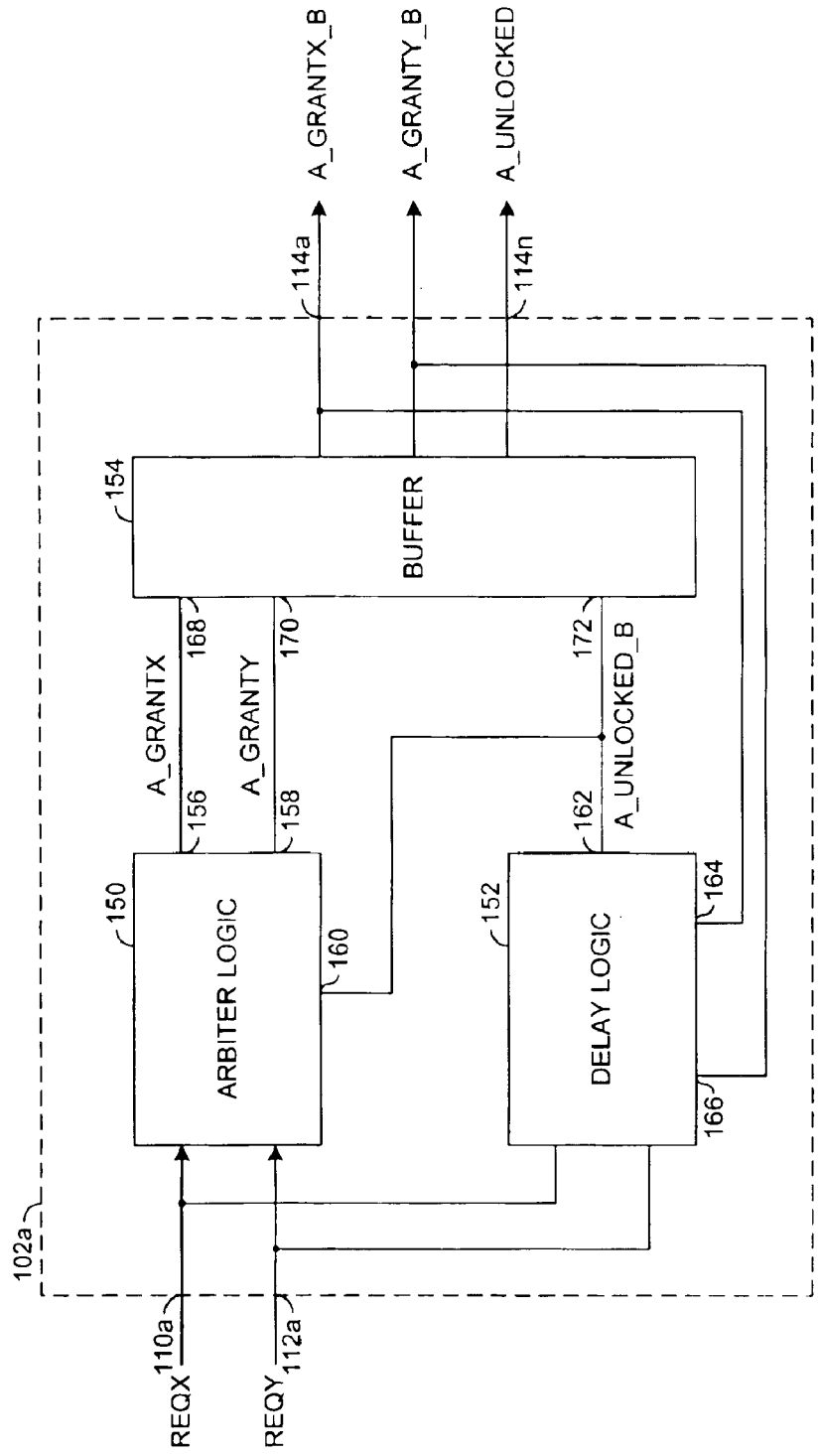
FIG. 4 is a block diagram of a locking arbiter of FIG. 3.

Referring to FIG. 4, a detailed block diagram of the arbiter 102a is shown. The arbiters 102b–102n may be similar to the arbiter 102a. The circuit 100 generally comprises a device (or circuit) 150, a device (or circuit) 152 and a device (or circuit 154). The circuit 150 may be implemented as an arbiter logic circuit. The circuit 152 may be implemented as a delay logic circuit. The circuit 154 may be implemented as a buffer circuit.

The signals REQX and REQY may be presented to both the arbiter logic 150 and the delay logic 152. The arbiter logic circuit 150 may also have an output 156 that may present a signal (e.g., A_GRANTX), an output 158 that may present a signal (e.g., A_GRANTY), and an input 160 that may receive a signal (e.g., A_UNLOCKED_B). The delay logic circuit 152 may have an output 162 that may present the signal A_UNLOCKED_B, an input 164 that may receive the signal A_GRANTX_B, and an input 166 that may receive the signal A_GRANTY_B. The buffer 154 may have an input 168 that may receive the signal A_GRANTX, an input 170 that may receive the signal A_GRANTY and an input 172 that may receive the signal A_UNLOCKED B. The buffer 154 may also present the signals A_GRANTX_B, A_GRANTY_B, and A_UNLOCKED. The signals A_GRANTX_B and A_GRANTY_B may act as a feedback to the delay logic 152.

Figure 5:
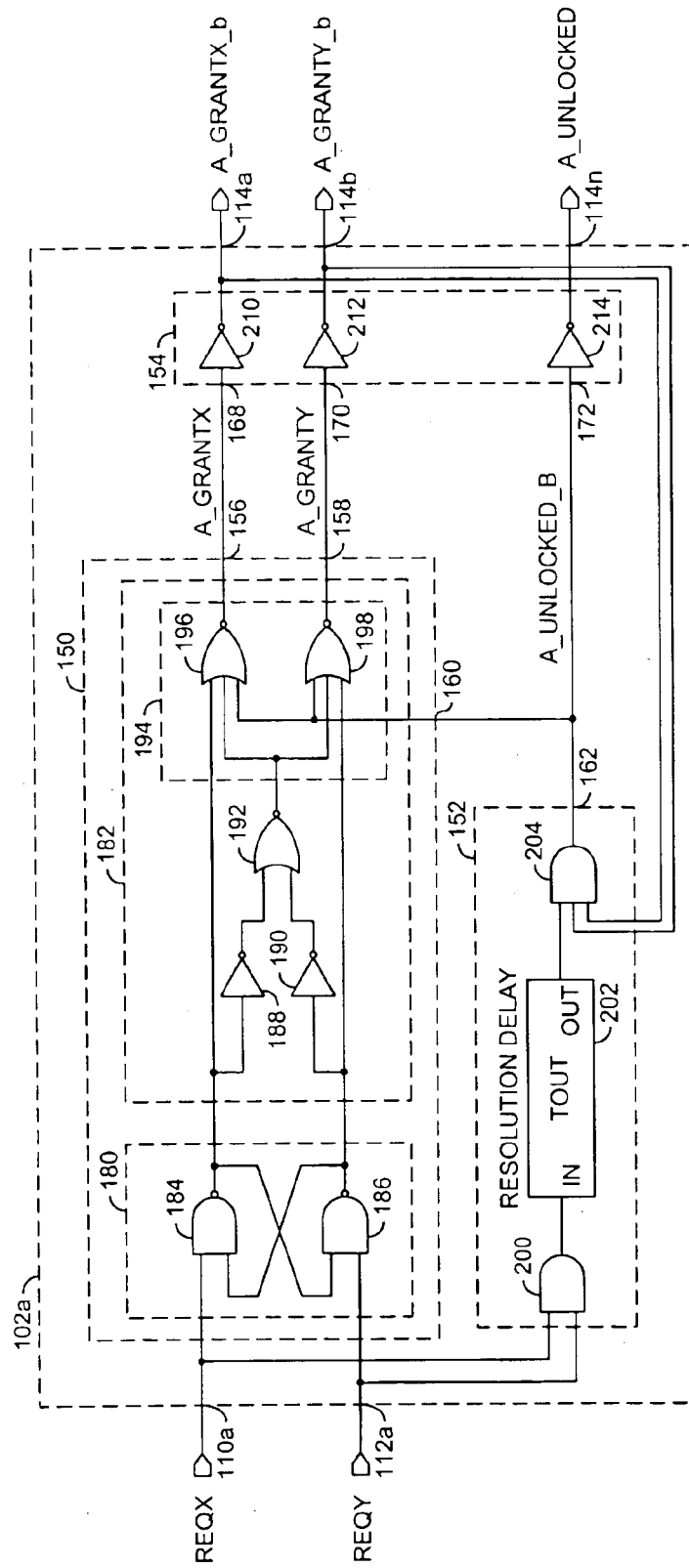
FIG. 5 is a more detailed block diagram of a locking arbiter of FIG. 4.

Referring to FIG. 5, a more detailed diagram of the arbiter circuit 102a is shown. The arbiter logic circuit 150 generally comprises an arbiter cell 180 and an interlock circuit 182. The arbiter 180 generally comprises a gate 184 and a gate 186. The gates 184 and 186 may be cross coupled. In one example, the gates 184 and 186 may be implemented as NAND gates. However, other combinations of gates may be implemented accordingly in order to meet the design criteria of a particular implementation.

The interlock circuit 198 generally comprises an inverter 188, an inverter 190, a gate 192 and an output block 194. The output block 194 generally comprises a gate 196 and a gate 198. The gates 196 and 198 may be implemented as OR gates. However, other combinations of gates may be implemented in order to meet the design criteria of a particular implementation. The interlock element 182 may disable the outputs of the gates 184 and 186 until a metastable condition is resolved. The inverters 188 and 190 may be implemented as inverters with low threshold voltages to avoid oscillation.

The circuit 152 generally comprises a gate 200, a circuit 202 and a gate 204. The gates 200 and 204 are shown implemented as AND gates. However, other combinations of gates may be implemented accordingly to meet the design criteria of a particular implementation. The circuit 202 may be implemented as a delay circuit. In one example, the circuit 202 may be implemented as a resolution delay circuit. The resolution delay circuit 202 may have a programmable (or configurable) delay. The gate 204 may receive an output of the delay 202, the signal A_GRANTX_B and the signal A_GRANTY_B. The gate 204 may present the signal A_UNLOCKED_B. The signal A_UNLOCKED_B may control a lock state of the arbiter logic circuit 130.

The circuit 154 generally comprises an inverter 210, an inverter 212 and an inverter 214. The inverter 210 may receive the signal A_GRANTX and present the signal A_GRANTX_B. The inverter 212 may receive the signal A_GRANTY and present the signal A_GRANTY_B. The inverter 214 may receive the signal A_UNLOCKED_B and present the signal A_UNLOCKED.

Figure 6:
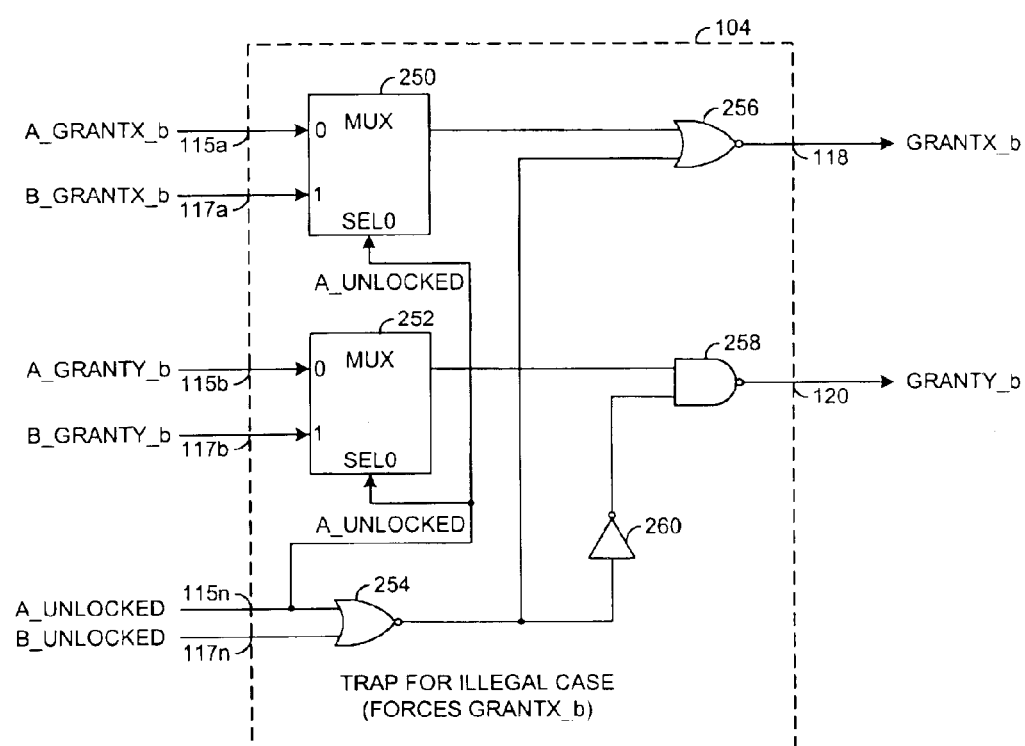
FIG. 6 is a detailed block diagram of a select circuit of FIG. 3.

Referring to FIG. 6, a detailed block diagram of the select circuit 104 is shown. In one example, the select circuit 104 may be implemented to select between the locking arbiter circuits 102a–102n. In another example, the select circuit 104 may be implemented as a trap device. For example, the circuit 104 may force the grant signal GRANTX_B if the arbiters 102a–102n become locked (at power up the request signals may be charged, such that the arbiters 102a–102n are in a locked state). The circuit 104 generally comprises a multiplexer 250, a multiplexer 252, a gate 254, a gate 256, a gate 258 and an inverter 260. The gates 254 and 256 may be implemented as NOR gates and the gate 258 may be implemented as a NAND gate. However, other combinations of gates may be implemented accordingly in order to meet the design criteria of a particular implementation. Additionally, an architecture of the select circuit 104 may be varied in order to meet the criteria of a particular implementation.

The multiplexer 250 may receive the signals A_GRANTX_B, B_GRANTX_B, and A_UNLOCKED. The multiplexer 250 may select a signal to present in response to the signal A_UNLOCKED. The multiplexer 250 may present a signal to a first input of the gate 256. The multiplexer 252 may receive the signals A_GRANTY_B, B_GRANTY_B, and A_UNLOCKED. The multiplexer 252 may select a signal to present in response to the signal A_UNLOCKED. The multiplexer 252 may present a signal to a first input of the gate 258. The gate 254 may have a first and second input that may receive the signals A_UNLOCKED and B_UNLOCKED, respectively. The gate 254 may present a signal to a second input of the gate 256 and the inverter 260. The inverter 260 may present a signal to a second input of the gate 258. The gate 256 may present the signal GRANTX_B and the gate 258 may present the signal GRANTY_B.

When arbitration occurs within the circuit 100, the arbiter cell 102a may lock if not resolved within a predefined time interval. The secondary arbiter cell 102n may become dominant if the primary locking arbiter 100a becomes metastable. The selection circuit 104 may be implemented to interface between the primary and secondary arbiters 102a and 102n to provide arbitration within a known time and without delays due to metastable events.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first arbiter cell configured to lock if one or more requests are not resolved within a first predetermined time period; and
    a second arbiter cell configured to be dominant if the first arbiter cell enters a metastable state.

2. The apparatus according to claim 1, further comprising:
    a selection device configured to arbitrate between said first and second arbiter cells within a second predetermined time period.

3. The apparatus according to claim 2, wherein said selection device is further configured to operate without delays due to metastable events.

4. The apparatus according to claim 1, wherein said first and second arbiter cells comprise phased locking arbiters.

5. The apparatus according to claim 1, wherein said apparatus comprises a dual-port arbitration circuit with phased locking arbiters.

6. The apparatus according to claim 1, wherein said first and second arbiter cells are configured to receive said one or more requests.

7. The apparatus according to claim 6, further comprising:
    one or more shifting circuits configured to shift at least one of said one or more requests.

8. The apparatus according to claim 1, wherein said first and second arbiter cells are configured to present one or more lock signals and one or more grant signals in response to said one or more requests.

9. The apparatus according to claim 8, further comprising a selection device configured to provide arbitration in response to said one or more lock signals and said one or more grant signals.

10. The apparatus according to claim 9, wherein said selection device comprises:
    one or more multiplexers; and
    one or more gates, wherein said one or more multiplexers and said one or more gates are coupled in series and controlled by said one or more lock signals.

11. An apparatus comprising:
    means for locking one or grant signals if a metastable state is entered;
    means for arbitrating said one or more grant signals within a second predetermined time period; and
    means for dominating if said one or more requests enter a metastable state.

12. A method for providing arbitration of a plurality of requests for a memory, comprising the steps of:
    (A) receiving one or more requests;
    (B) locking if said one or more requests are not resolved within a first predetermined time period; and
    (C) dominating if said one or more requests enter a metastable state.

13. The method according to claim 12, further comprising:
    arbitrating between said locking step and said dominating step within a second predetermined time period.

14. The method according to claim 13, wherein said arbitrating step further comprises:
    operating with predictable and reduced delays due to metastable events.

15. The method according to claim 12, wherein said locking step further comprises locking a first arbiter cell and said dominating step further comprises dominating a second arbiter cell.

16. The method according to claim 12, further comprising the step of:
    shifting at least one of said plurality of requests.

17. The method according to claim 12, further comprising:
    generating one or more lock signals and one or more grant signals.

18. The method according to claim 17, further comprising:
    arbitrating between said one or more grant signals in response to said one or more lock signals.

19. An apparatus comprising:
    a first arbiter cell configured to lock if one or more requests are not resolved within a first predetermined time period, wherein said apparatus comprises a dual-port arbitration circuit with phased locking arbiters.

* * * * *